United States Patent
Onishi

(10) Patent No.: US 10,041,989 B2
(45) Date of Patent: Aug. 7, 2018

(54) CIRCUIT BOARD WITH INSPECTION TERMINALS

(71) Applicant: Panasonic Liquid Crystal Display Co., Ltd., Hyogo (JP)

(72) Inventor: Toshiki Onishi, Hyogo (JP)

(73) Assignee: PANASONIC LIQUID CRYSTAL DISPLAY CO., LTD., Hyogo (JP)

( * ) Notice: Subject to any disclaimer, the term of this patent is extended or adjusted under 35 U.S.C. 154(b) by 92 days.

(21) Appl. No.: 15/064,600

(22) Filed: Mar. 9, 2016

(65) Prior Publication Data
US 2017/0261542 A1     Sep. 14, 2017

(51) Int. Cl.
*G01R 31/04*     (2006.01)
*G01R 27/02*     (2006.01)

(52) U.S. Cl.
CPC .............. *G01R 31/04* (2013.01); *G01R 27/02* (2013.01)

(58) Field of Classification Search
CPC ..................................................... G01R 31/04
See application file for complete search history.

(56) References Cited

U.S. PATENT DOCUMENTS

| | | | | | |
|---|---|---|---|---|---|
| 5,044,963 | A | * | 9/1991 | Kukkonen | H05K 1/0219 333/260 |
| 5,963,045 | A | * | 10/1999 | Zink | G01R 1/07342 324/750.16 |
| 6,801,436 | B2 | * | 10/2004 | Pearson | H05K 1/142 361/732 |
| 2009/0102826 | A1 | * | 4/2009 | Oke | G02F 1/134363 345/211 |
| 2014/0015118 | A1 | * | 1/2014 | Bae | H01L 23/3675 257/713 |
| 2014/0097865 | A1 | * | 4/2014 | Han | H01L 23/538 324/762.01 |

FOREIGN PATENT DOCUMENTS

| | | | | |
|---|---|---|---|---|
| CN | 203746040 U | * | 7/2014 | |
| GB | 2395072 A | * | 5/2004 | ......... G01R 31/2818 |
| JP | 2003115648 A | * | 4/2003 | |

* cited by examiner

*Primary Examiner* — Walter L Lindsay, Jr.
*Assistant Examiner* — Milton Gonzalez
(74) *Attorney, Agent, or Firm* — HEA Law PLLC

(57) ABSTRACT

Provided is a circuit board including inspection terminals, the circuit board including: a connection terminal, which is arranged on a front surface or in an inner layer of the circuit board, and is electrically connected to an object to be inspected; and three or more inspection terminals, which are electrically connected to the connection terminal, and are configured to measure a resistance value of the object be inspected, each of the three or more inspection terminals being arranged on a side surface of the circuit board.

15 Claims, 15 Drawing Sheets

CIRCUIT BOARD WITH INSPECTION TERMINALS

BACKGROUND

1. Technical Field

The present application relates to a circuit board and a display device.

2. Description of the Related Art

A display device includes a display panel, a driver IC configured to drive the display panel, and a circuit board including a control circuit configured to control the driver IC. For example, the circuit board is connected to the display panel via a flexible board. Further, electronic components such as the driver IC are mounted by, for example, chip-on glass (COG) in which the electronic components are arranged on a substrate of the display panel or chip-on film (COF) in which the electronic components are arranged on the flexible board.

SUMMARY

In some cases, inspection terminals are mounted on the circuit board so as to measure a connection resistance between the boards or a connection resistance between the driver IC and the board. The inspection terminals are formed relatively larger so as to enable abutment of a measurement jig for resistance measurement. Therefore, the inspection terminals have lessened a region for arranging other electronic components or wirings.

The present application has been made in view of the above-mentioned problem, and has an object to secure a larger region for arranging components or wirings in the circuit board including the inspection terminals.

In order to solve the above-mentioned problem, according to one embodiment of the present application, there is provided a circuit board, including: a connection terminal, which is arranged on a front surface or in an inner layer of the circuit board, and is electrically connected to an object to be inspected; and three or more inspection terminals, which are electrically connected to the connection terminal, and are configured to measure a resistance value of the object to be inspected, each of the three or more inspection terminals being arranged on a side surface of the circuit board.

In the circuit board according to the one embodiment of the present application, the connection terminal may be arranged on a first edge side of the circuit board, and the each of the three or more inspection terminals may be arranged on the side surface at an edge other than the first edge.

In the circuit board according to the one embodiment of the present application, the each of the three or more inspection terminals may be arranged in a recessed shape in the side surface of the circuit board.

In the circuit board according to the one embodiment of the present application, the each of the three or more inspection terminals may be arranged in a projecting shape in the side surface of the circuit board.

In the circuit board according to the one embodiment of the present application, the each of the three or more inspection terminals may be arranged in a planar shape along the side surface of the circuit board.

In the circuit board according to the one embodiment of the present application, the three or more inspection terminals may be arranged side by side in one row along the side surface of the circuit board.

In the circuit board according to the one embodiment of the present application, the three or more inspection terminals may have equal distances between adjacent inspection terminals.

In the circuit board according to the one embodiment of the present application, the three or more inspection terminals may have different distances between adjacent inspection terminals.

In the circuit board according to the one embodiment of the present application, the connection terminal may include a first connection terminal and a second connection terminal, the three or more inspection terminals may include a first inspection terminal, a second inspection terminal, and a third inspection terminal, the first connection terminal may be electrically connected to the first inspection terminal via a first connection wiring, the second connection terminal may be electrically connected to the second inspection terminal and the third inspection terminal via a second connection wiring, and the second connection wiring may be formed so as to be extended from the second connection terminal, and then be branched to be connected to each of the second inspection terminal and the third inspection terminal.

In the circuit board according to the one embodiment of the present application, the second connection wiring may be branched at a position closer to the second connection terminal than to the second inspection terminal and the third inspection terminal.

In the circuit board according to the one embodiment of the present application, the three or more inspection terminals may include seven terminals including a first inspection terminal, a second inspection terminal, a third inspection terminal, a fourth inspection terminal, a fifth inspection terminal, a sixth inspection terminal, and a seventh inspection terminal, the first inspection terminal, the second inspection terminal, the third inspection terminal, and the fourth inspection terminal may be used for measuring a resistance value of a first object to be inspected, the third inspection terminal, the fourth inspection terminal, the fifth inspection terminal, and the sixth inspection terminal may be used for measuring a resistance value of a second object to be inspected, and the fourth inspection terminal, the fifth inspection terminal, the sixth inspection terminal, and the seventh inspection terminal may be used for measuring a resistance value of a third object to be inspected.

In the circuit board according to the one embodiment of the present application, parts of the each of the three or more inspection terminals may be arranged further on the front surface and a back surface of the circuit board.

In the circuit board according to the one embodiment of the present application, the side surface of the circuit board may have one of a recessed portion and a projecting portion formed therein so as to position a measurement jig when the measurement jig is brought into abutment against the three or more inspection terminals.

In the circuit board according to the one embodiment of the present application, the circuit board may further include a connection wiring configured to electrically connect the connection terminal and corresponding one of the three or more inspection terminals to each other, and the connection wiring may be formed on a back surface or in the inner layer of the circuit board.

In the circuit board according to the one embodiment of the present application, the connection wiring may be electrically connected to the connection terminal and corresponding one of the three or more inspection terminals via a through hole formed through the circuit board.

In the circuit board according to the one embodiment of the present application, at least one of the three or more inspection terminals may be electrically connected to a ground.

In the circuit board according to the one embodiment of the present application, at least one of the three or more inspection terminals may be electrically connected to a heat radiation pad configured to radiate heat of an IC included in the circuit board.

According to one embodiment of the present application, there is provided a display device, including the above-mentioned circuit board.

In the display device according to one embodiment of the present application, the display device may further include: a display panel; a frame, which is made of a metal, and is configured to support the display panel from a back surface side thereof; and a protection tape configured to cover the circuit board, the circuit board may be arranged on a back surface side of the frame, the protection tape may be electronically connected to at least one of the three or more inspection terminals, and the protection tape may be electrically connected to the frame.

DETAILED DESCRIPTION

Figure 1:
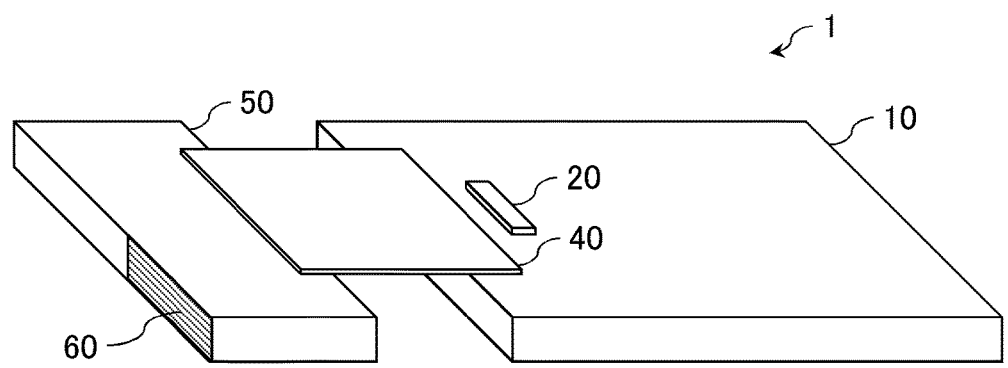
FIG. 1 is a perspective view for illustrating a schematic configuration of a display device according to an embodiment of the present application.

Now, an embodiment of the present application is described with reference to the drawings. In the embodiment of the present application, as an example of a circuit board, a control circuit board included in a display device is exemplified, but the present application is not limited to this example, and the circuit board may be a circuit board included in other apparatus. Note that, in the drawings, the same or equivalent elements are denoted by the same reference symbols, and redundant description thereof is omitted.

FIG. 1 is a perspective view for illustrating a schematic configuration of a display device 1 according to this embodiment. As illustrated in FIG. 1, the display device 1 includes a display panel 10 configured to display an image, a driver IC 20 configured to drive the display panel 10, a flexible printed board (FPC) 40, a control circuit board 50 having mounted thereon a control circuit configured to control the driver IC 20, and a backlight unit (not shown) configured to irradiate the display panel 10 with light from the back surface side.

The display panel 10 includes the driver IC 20 serving as a drive circuit used for displaying an image. The display device 1 according to this embodiment employs a COG system in which the driver IC 20 is directly mounted on a glass substrate of the display panel 10. Note that, the display panel 10 may employ a COF system in which the driver IC 20 is mounted on the FPC 40.

The control circuit board 50 is electrically connected to the display panel 10 via the FPC 40. The control circuit board 50 has, for example, a timing controller mounted thereon, which is configured to control the operation of the driver IC 20. The control circuit board 50 may be a rigid board, or a rigid flexible board integrally formed with the FPC 40.

Further, the control circuit board 50 includes inspection terminals. The inspection terminals are terminals used for performing various inspections in the display device 1. In the following, the inspection terminals in this embodiment are described as a resistance measurement pad 60 including inspection terminals configured to measure a resistance of an object to be inspected.

Figure 2:
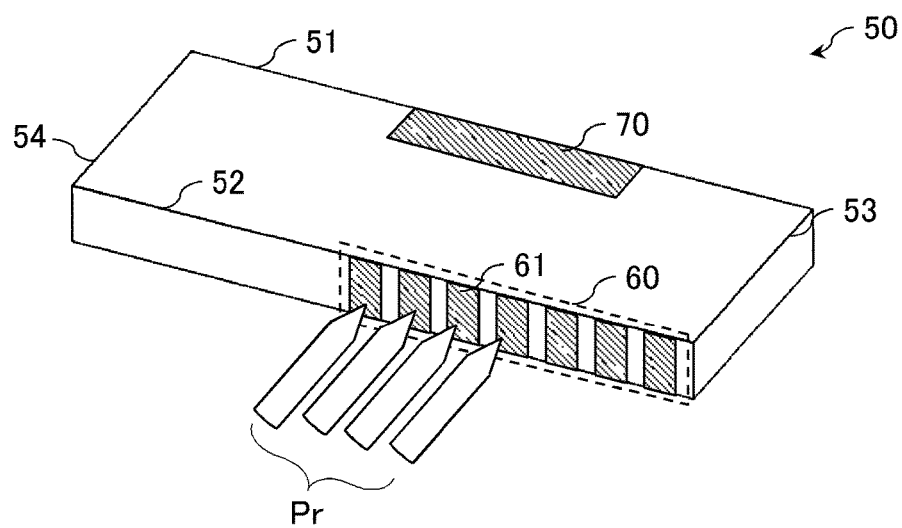
FIG. 2 is a perspective view for illustrating an example of a control circuit board including a resistance measurement pad according to the embodiment.

FIG. 2 is a perspective view for illustrating an example of the control circuit board 50 including the resistance measurement pad 60 according to this embodiment. As illustrated in FIG. 2, in the control circuit board 50 according to this embodiment, a connection terminal 70 electrically connected to an object to be inspected is arranged on a front surface of the control circuit board 50. Further, on a side surface of the control circuit board 50, the resistance measurement pad 60 being electrically connected to the connection terminal 70 and including three or more inspection terminals 61 (in FIG. 2, seven inspection terminals 61) configured to measure the resistance value of the object to be inspected is arranged. A measurement jig such as probe pins Pr is brought into abutment against the resistance measurement pad 60. In FIG. 2, for the sake of convenience, the illustration of electronic components and wiring patterns other than the connection terminal 70 and the resistance measurement pad 60 is omitted. In this embodiment, the FPC 40 (not shown) is electrically connected to the connection terminal 70, and the control circuit board 50 and the display panel 10 (not shown) are electrically connected to each other via the FPC 40. Therefore, the connection terminal 70 is arranged on the front surface of the control circuit board 50 on a first edge 51 side, and the resistance measurement pad 60 is arranged on the side surface on a second edge 52 side opposed to the first edge 51 at which the connection terminal 70 is arranged. Note that, the resistance measurement pad 60 may be arranged on a side surface on a third edge 53 side connecting the first edge 51 and the second edge 52 or on a fourth edge 54 side connecting the first edge 51 and the second edge 52. In other words, the resistance measurement pad 60 may be arranged on a side surface at an edge different from the first edge 51 at which the connection terminal 70 is arranged. By arranging the resistance measurement pad 60 on a side surface around which the FPC 40 and the display panel 10 are not arranged as described above, the probe pins Pr can be easily brought into abutment against the resistance measurement pad 60. Further, the resistance measurement pad 60 may be arranged on the side surface on the first edge 51 side on which the connection terminal 70 is arranged. Note that, the connection terminal 70 is not limited to the example in which the connection terminal 70 is arranged along the edge of the control circuit 50, and may be arranged at a center portion of the control circuit board 50. In this case, the resistance measurement pad 60 may be arranged on any side surface of the control circuit board 50.

Figure 3:
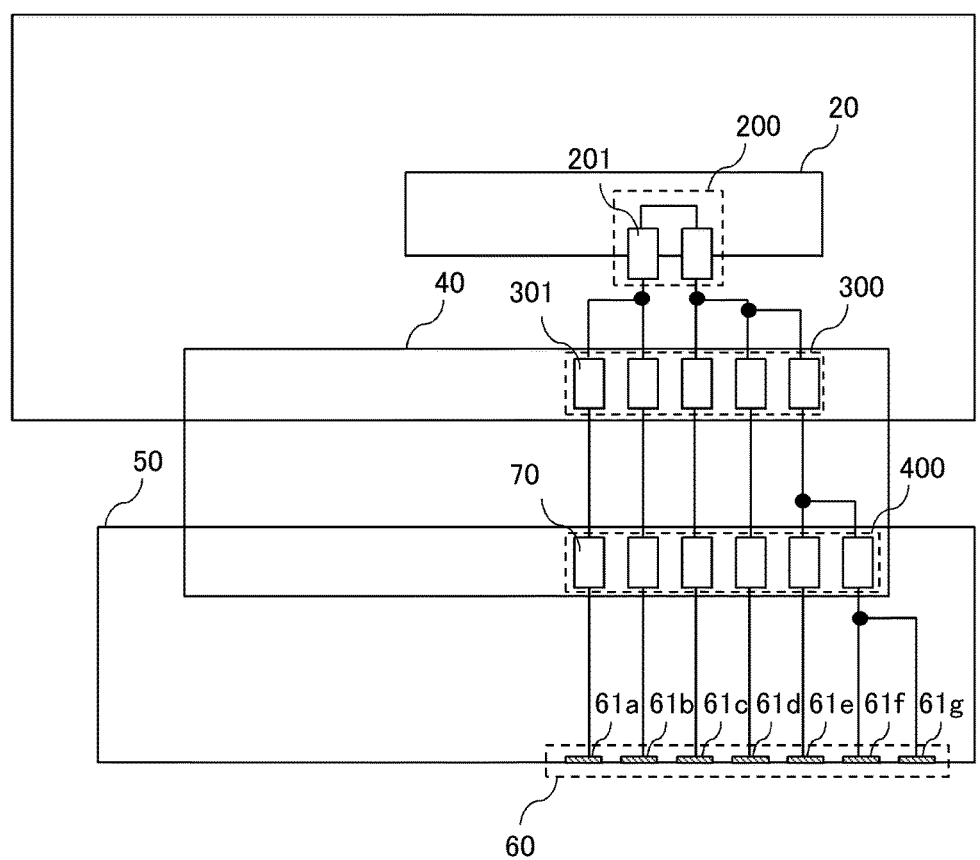
FIG. 3 is a view for schematically illustrating objects to be inspected according to the embodiment.

FIG. 3 is a view for schematically illustrating the objects to be inspected according to this embodiment. As illustrated in FIG. 3, a first object to be inspected in this embodiment is a connection portion between the glass substrate of the display panel 10 and the driver IC 20 (hereinafter referred to as "COG connection portion 200"), a second object to be inspected is a connection portion between the glass substrate of the display panel 10 and the FPC 40 (hereinafter referred to as "FOG connection portion 300"), and a third object to be inspected is a connection portion between the control circuit board 50 (in this embodiment, the connection terminal 70 of the control circuit board 50) and the FPC 40 (hereinafter referred to as "FOB connection portion 400"). The control circuit board 50 and the FPC 40, the FPC 40 and the glass substrate of the display panel 10, and the glass substrate of the display panel 10 and the driver IC 20 are each pressure bonded to each other with use of an anisotropic conductive film to secure electrical connection. A connection terminal group of each pressure-bonded portion corresponds to the object to be inspected according to this embodiment. In FIG. 3, the COG connection portion 200 includes two COG connection terminals 201, the FOG connection portion 300 includes five FOG connection terminals 301, and the FOB connection portion 400 includes six connection terminals 70. Further, in order to measure the resistance values of three positions, specifically, the COG connection portion 200, the FOG connection portion 300, and the FOB connection portion 400, the resistance measurement pad 60 includes seven inspection terminals 61 (first inspection terminal 61a to seventh inspection terminal 61g). The seven inspection terminals 61 of the resistance measurement pad 60 are arranged side by side in one row on the side surface of the control circuit board 50. Each COG connection terminal 201 of the COG connection portion 200 and each FOG connection terminal 301 of the FOG connection portion 300 are electrically connected to each other via a wiring. Each FOG connection terminal 301 of the FOG connection portion 300 and each connection terminal 70 of the FOB connection portion 400 are electrically connected to each other via a wiring. Each connection terminal 70 and each inspection terminal 61 are electrically connected to each other via a wiring. In this case, the resistance values of the COG connection portion 200, the FOG connection portion 300, and the FOB connection portion 400 are measured to inspect the connection reliability at each connection portion. Note that, the configuration of the object to be inspected and the wiring patterns illustrated in FIG. 3 are suitable for resistance measurement using a four-terminal method to be described later, but the configuration of the object to be inspected and the wiring patterns are not limited to this example.

Figure 4:
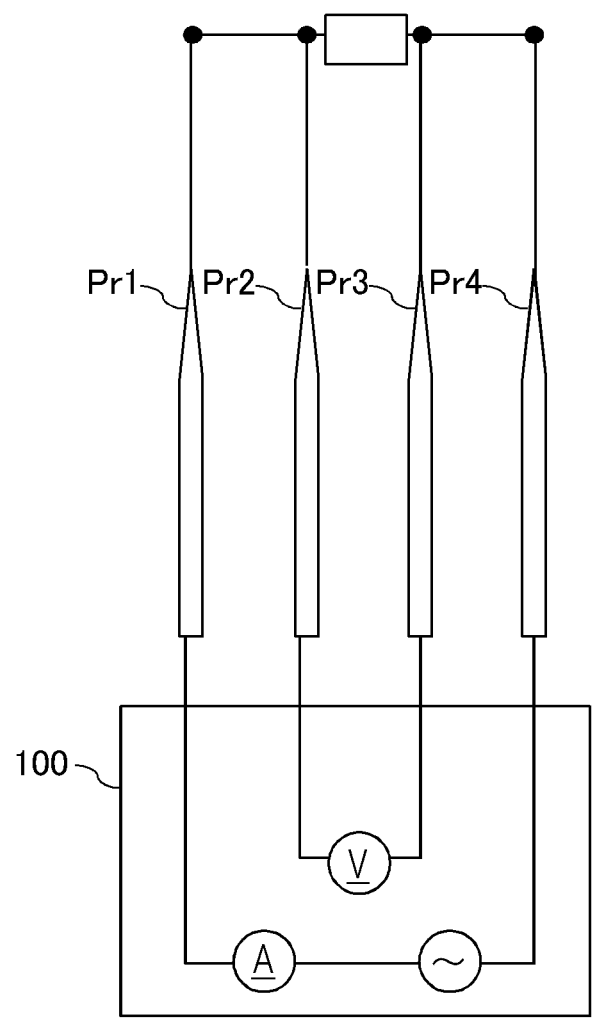
FIG. 4 is a view for illustrating a resistance measurement method according to the embodiment.

FIG. 4 is a view for illustrating a resistance measurement method according to this embodiment. In this embodiment, a measurement device 100 performs resistance measurement by a so-called four-terminal method using four probe pins Pr (Pr1, Pr2, Pr3, and Pr4). The four-terminal method is a measurement method used for low-resistance measurement, and is effective for an object to be inspected having a low contact resistance and being susceptible to the wiring resistance. The resistance value of the COG connection portion 200 is about several tens of Ω, the resistance value of the FOG connection portion 300 is about several Ω, and the resistance value of the FOB connection portion 400 is about several tens of mΩ. Therefore, the contact resistance of each connection portion is low, and hence the measurement by the four-terminal method is effective in this embodiment. The measurement device 100 includes a constant current source, an ammeter, and a voltmeter. The probe pin Pr1 and the probe pin Pr4 are connected to the constant current source to supply a constant current between measurement points of the object to be inspected. The probe pin Pr2 and the probe pin Pr3 are connected to the voltmeter to detect a voltage value between measurement points. The measurement device 100 is configured to cause a predetermined current to flow from the constant current source to the object to be inspected, and to cause the ammeter to detect the current flowing through the object to be inspected and cause the voltmeter to detect the voltage generated between the measurement points of the object to be inspected. Further, the measurement device 100 is configured to calculate the resistance value of the object to be inspected by dividing the voltage value detected by the voltmeter by the current value detected by the ammeter. In this case, the current supplied from the constant current source hardly flows through a path passing through the probe pin Pr2, the voltmeter, and the probe pin Pr3 during voltage detection by the voltmeter. Therefore, without being affected by the voltage drop caused by the wiring resistance in a region from the object to be inspected to the resistance measurement pad 60, the resistance value of the object to be inspected can be measured at high accuracy.

Next, a method of measuring the resistance value of each connection portion is described with reference to FIG. 5 to FIG. 7.

Figure 5:
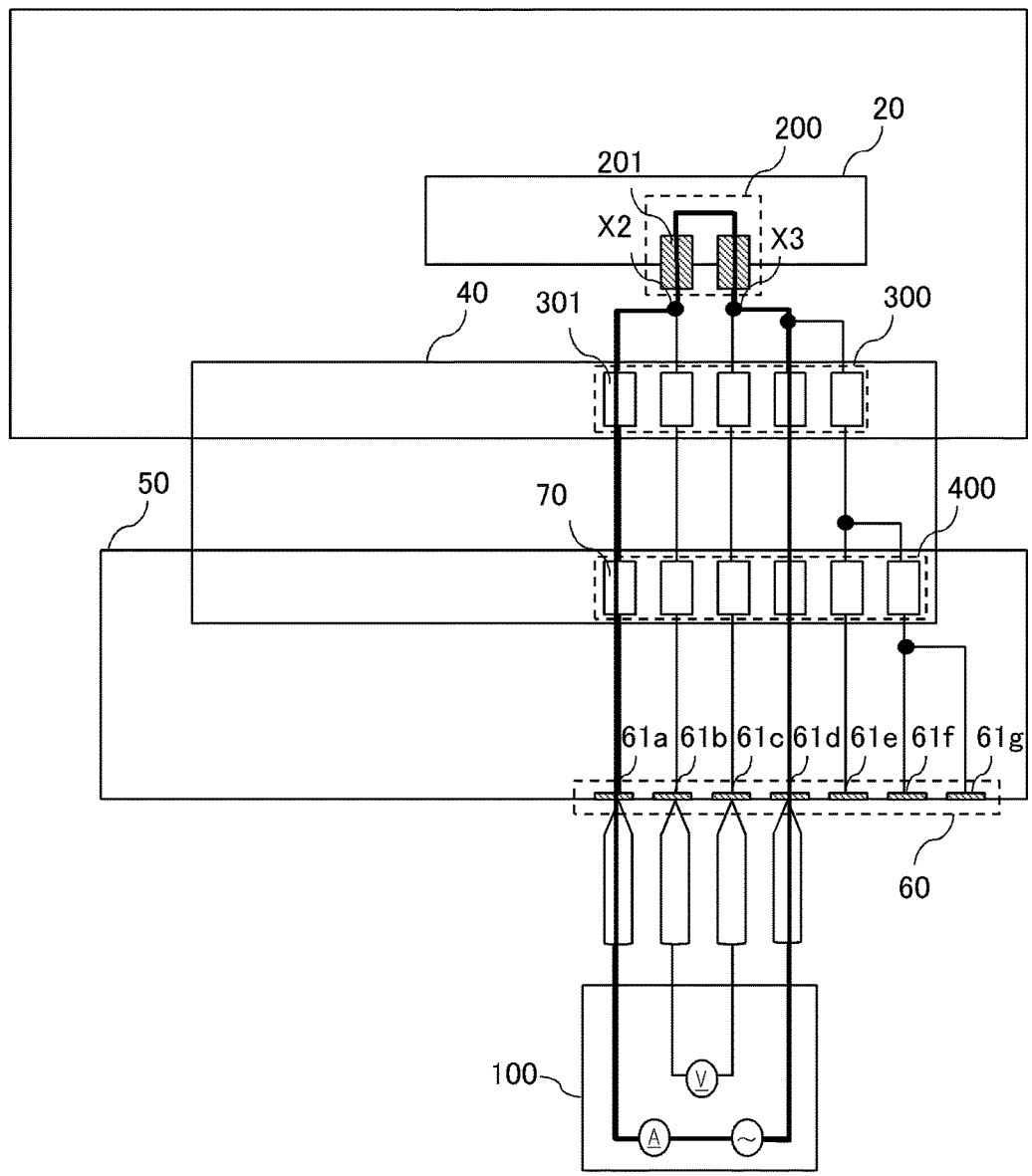
FIG. 5 is a view for illustrating resistance value measurement at a COG connection portion.

FIG. 5 is a view for illustrating resistance value measurement at the COG connection portion 200. As illustrated in FIG. 5, the first inspection terminal 61a, the second inspection terminal 61b, the third inspection terminal 61c, and the fourth inspection terminal 61d are used for measuring the resistance value of the COG connection portion 200. The probe pin Pr1 to the probe pin Pr4 are brought into abutment against the first inspection terminal 61a to the fourth inspection terminal 61d, respectively. Thus, a current flows along a path represented by the thick line to measure the resistance value of the COG connection portion 200. In FIG. 5, the resistance values of the two COG connection terminals 201 are measured.

Figure 6:
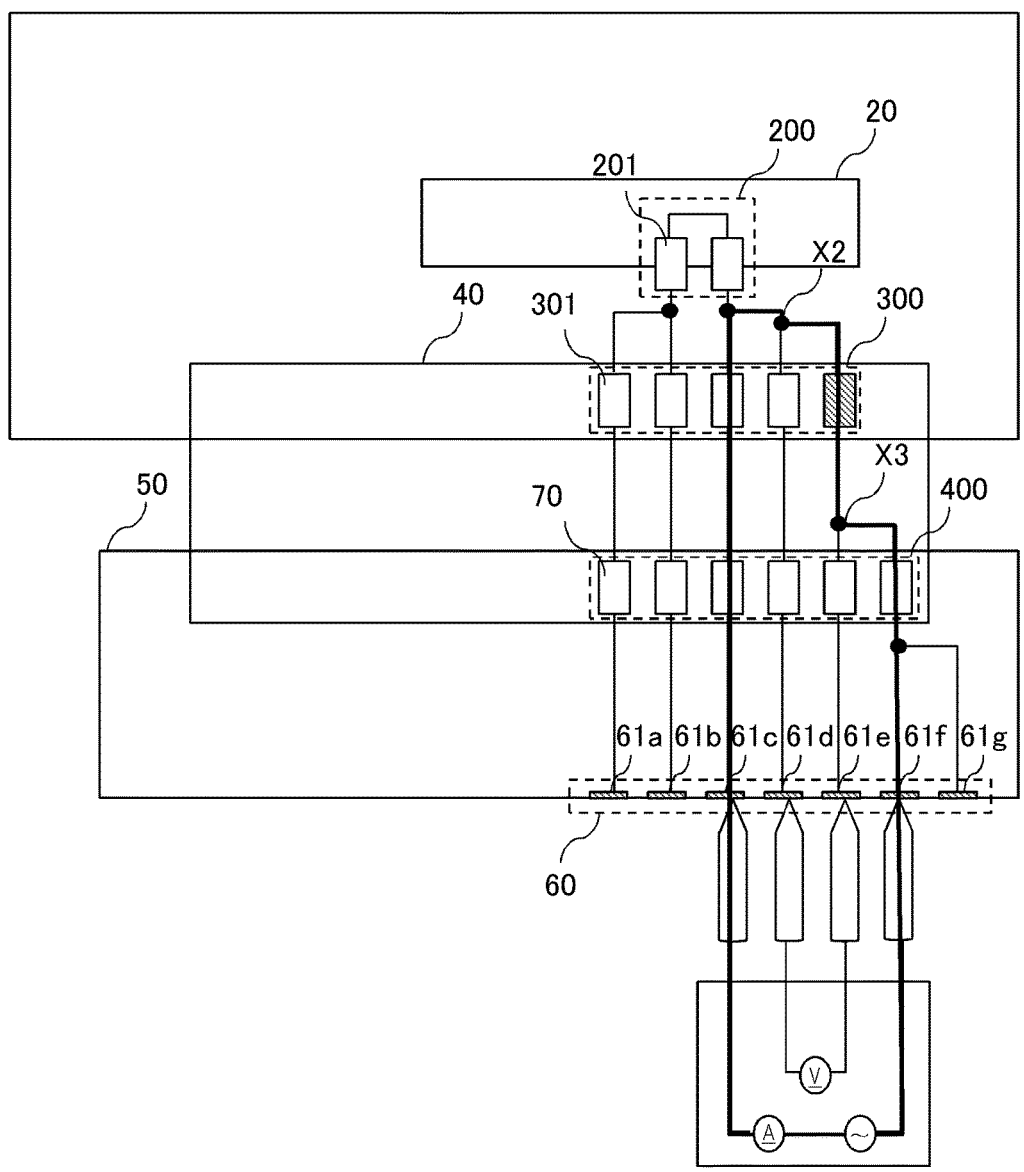
FIG. 6 is a view for illustrating resistance value measurement at a FOG connection portion.

FIG. 6 is a view for illustrating resistance value measurement at the FOG connection portion 300. As illustrated in FIG. 6, the third inspection terminal 61c to the sixth inspection terminal 61f are used for measuring the resistance value of the FOG connection portion 300. The probe pin Pr1 to the probe pin Pr4 are brought into abutment against the third inspection terminal 61c to the sixth inspection terminal 61f, respectively. Thus, a current flows along a path represented by the thick line to measure the resistance value of the FOG connection portion 300. In FIG. 6, the resistance value of the rightmost FOG connection terminal 301 is measured.

Figure 7:
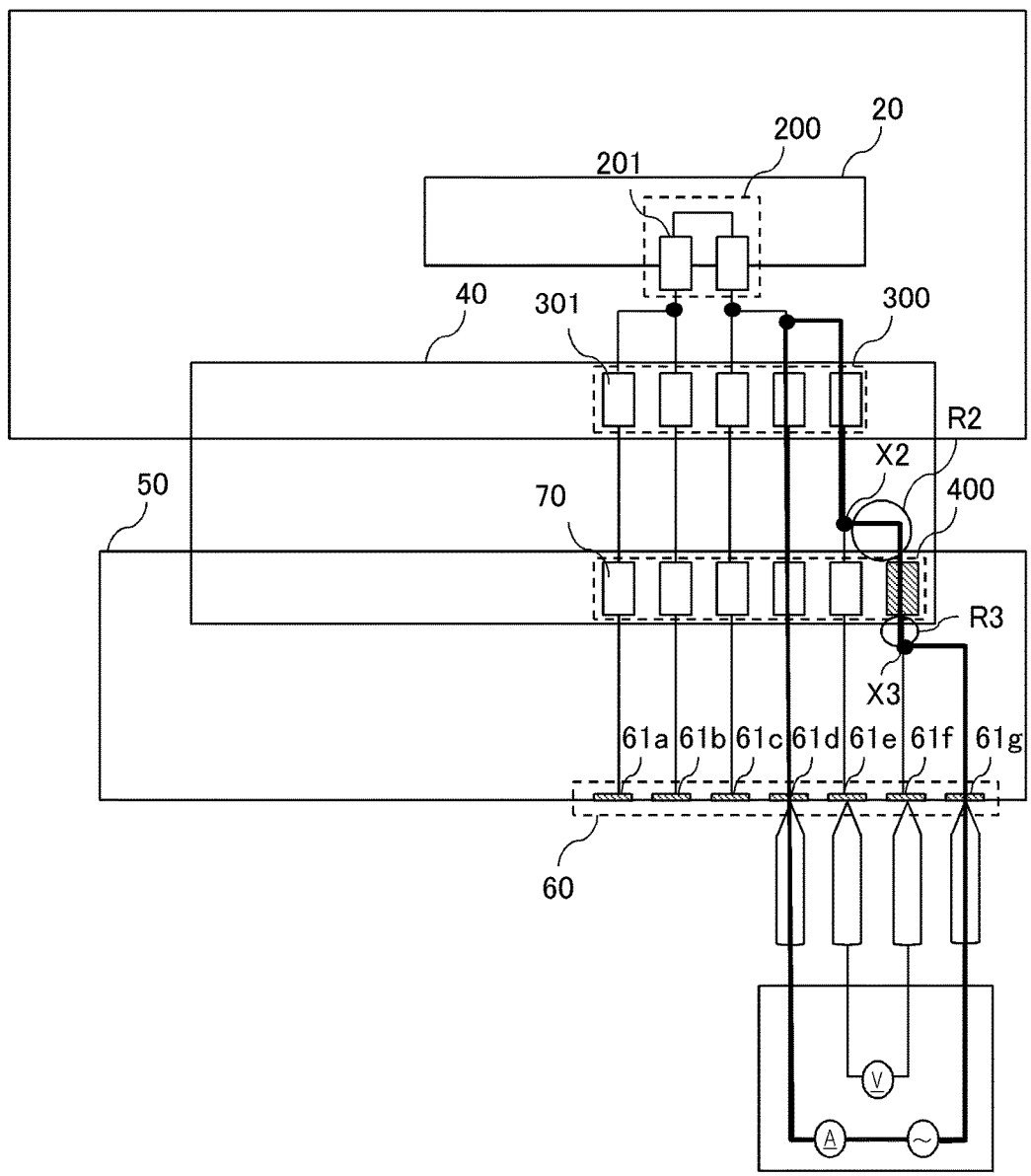
FIG. 7 is a view for illustrating resistance value measurement at a FOB connection portion.

FIG. 7 is a view for illustrating resistance value measurement at the FOB connection portion 400. As illustrated in FIG. 7, the fourth inspection terminal 61d to the seventh inspection terminal 61g are used for measuring the resistance value of the FOB connection portion 400. The probe pin Pr1 to the probe pin Pr4 are brought into abutment against the fourth inspection terminal 61d to the seventh inspection terminal 61g, respectively. Thus, a current flows along a path represented by the thick line to measure the resistance value of the FOB connection portion 400. In FIG. 7, the resistance value of the rightmost COG connection terminal 70 is measured.

In FIG. 5 to FIG. 7, the current path includes branching points (X2 and X3) at which the path is branched to the wiring passing through the probe pin Pr2, the voltmeter, and the probe pin Pr3. In this case, the resistance measurement by the four-terminal method can measure the resistance value of the object to be inspected at high accuracy without being affected by the voltage drop caused by the wiring resistance, but the measurement is affected by the voltage drop caused by the wiring resistances in a path between the branching point X2 and the object to be inspected and in a path between the object to be inspected and the branching point X3. For example, the measurement value includes wiring resistances in a path (path R2) from the branching point X2 to the connection terminal 70 serving as the object to be inspected and in a path (path R3) from the connection terminal 70 serving as the object to be inspected to the branching point X3, which are illustrated in FIG. 7. In view of this, in order to measure the resistance value of the object to be inspected at high accuracy while reducing the influence of the wiring resistances of the path R2 and the path R3, it is preferred that the wiring of the path R2 and the path R3 be short and thick so as to reduce the wiring resistances of the path R2 and the path R3.

Figure 8:
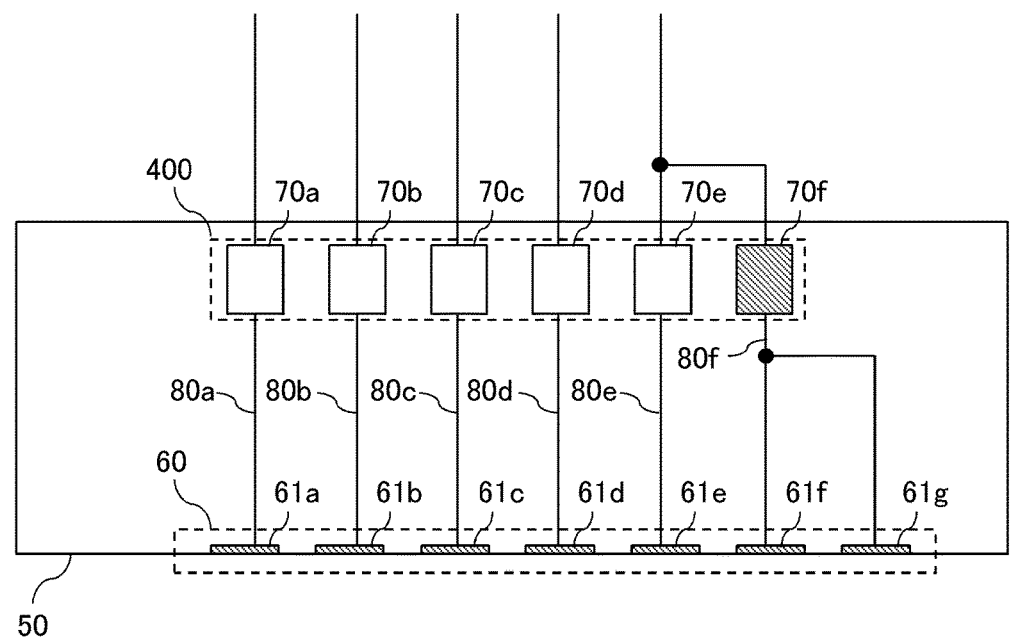
FIG. 8 is a view for illustrating the configuration of wiring of the control circuit board.

Specifically, description is given of the configuration of the wiring for reducing the wiring resistance in the path between the branching point and the object to be inspected when the resistance of the FOB connection portion 400 is measured. FIG. 8 is a view for illustrating the configuration of the wiring of the control circuit board 50. As illustrated in FIG. 8, the control circuit board 50 has formed thereon the resistance measurement pad 60 including the seven inspection terminals 61 (first inspection terminal 61a to seventh inspection terminal 61g) and the FOB connection portion 400 including the six connection terminals 70 (70a to 70f).

Further, connection wirings 80 (80a to 80e) configured to electrically connect between the connection terminals 70a to 70e and the first inspection terminal 61a to the fifth inspection terminal 61e, respectively, are formed. The connection terminal 70f is electrically connected to the sixth inspection terminal 61f and the seventh connection terminal 61g via a connection wiring 80f. Further, the connection wiring 80f is formed so as to be extended from the connection terminal 70f, and then be branched to be connected to each of the sixth inspection terminal 61f and the seventh inspection terminal 61g. In this case, it is assumed that, when the resistance of the FOB connection portion 400 is measured, the resistance value of the connection terminal 70f is measured. As described above, by forming the connection wiring 80f electrically connected to the connection terminal 70f serving as the object to be inspected so as to be branched, as compared to the case where the connection wiring 80f is formed so as not to be branched, the path between the object to be inspected and the branching point can be shortened. As a result, the wiring resistance between the object to be inspected and the branching point can be reduced.

Further, it is preferred that the position at which the connection wiring 80f is branched be closer to the connection terminal 70f than to the sixth inspection terminal 61f and the seventh inspection terminal 61g. With this, the path between the object to be inspected and the branching point can be further shortened. The wiring resistance between the object to be inspected and the branching point can be reduced.

Note that, each connection terminal 70 and each inspection terminal 61 may be connected on a one-to-one basis without branching the connection wiring 80f. In this case, a seventh connection terminal 70g may be formed so that the seventh connection terminal 70g and the seventh inspection terminal 61g are electrically connected to each other.

As described above, by arranging the seven inspection terminals 61 of the resistance measurement pad 60 side by side in one row, and sharing a part of the inspection terminals 61 with the plurality of objects to be inspected, the number of terminals of the resistance measurement pad 60 can be reduced. Note that, the number of terminals of the resistance measurement pad 60 may be 8 or more.

Further, the three or more inspection terminals 61 forming the resistance measurement pad 60 may have equal distances between adjacent inspection terminals 61. By arranging the three or more inspection terminals 61 at equal intervals side by side, the plurality of probe pins Pr can be easily and simultaneously brought into abutment against the resistance measurement pad 60. Further, when the measurement is performed while sequentially shifting the probe pins Pr, such as when the measurement of the COG connection portion 200, the measurement of the FOG connection portion 300, and the measurement of the FOB connection portion 400 are sequentially performed, the probe pins Pr may be easily brought into abutment against the resistance measurement pad 60. Note that, the distance between the adjacent inspection terminals 61 may vary in the three or more inspection terminals 61 forming the resistance measurement pad 60.

Further, the measurement device 100 may be configured to measure the resistance value of the object to be inspected by a three-terminal method. The three-terminal method is a measurement method to be used in low-resistance or high-resistance measurement. In the measurement method to be used for the purpose of low-resistance measurement, the resistance value of the object to be inspected can be measured at high accuracy without being affected by the voltage drop caused by the wiring resistance in the region from the object to be inspected to the resistance measurement pad 60, though not to the extent of the four-terminal method. In the measurement method to be used for the purpose of high-resistance measurement, whether or not the object to be inspected is short-circuited and a desired insulating resistance is secured can be inspected. Further, the measurement device 100 may be configured to measure the impedance of the object to be inspected by a five-terminal method. In the five-terminal method, the impedance of the object to be inspected can be measured at high accuracy without being affected by the capacitance between the object to be inspected and the surrounding metal.

Note that, the resistance measurement pad 60 may include terminals for measurement by the three-terminal method and terminals for measurement by the four-terminal method in a mixed manner. For example, among the COG connection portion 200, the FOG connection portion 300, and the FOB connection portion 400, the COG connection portion 200 has a relatively higher resistance value, and hence the resistance value thereof may be measured by the three-terminal method. By measuring the resistance value of a part of the objects to be inspected by the three-terminal method, the number of terminals of the resistance measurement pad 60 can be reduced. Further, when there are provided an object to be inspected whose connection reliability is inspected and an object to be inspected whose securement of an insulating resistance is inspected, the resistance measurement pad 60 may include terminals for measurement by the three-terminal method and terminals for measurement by the four-terminal method in a mixed manner. Further, the resistance measurement pad 60 may include terminals for measurement by the five-terminal method in a mixed manner.

Further, the object to be measured may be one or two of the COG connection portion 200, the FOG connection portion 300, and the FOB connection portion 400 described above. When one object is to be measured, the measurement device 100 can measure the resistance value of the object to be inspected as long as the resistance measurement pad 60 includes at least three inspection terminals 61. Further, the object to be measured is not limited to the COG connection portion 200, the FOG connection portion 300, and the FOB connection portion 400 described above, and the connection portion between another electronic component and the board may be the object to be measured.

Further, each inspection terminal 61 of the resistance measurement pad 60 is formed to be relatively larger to enable abutment of the probe pin Pr. Therefore, when the resistance measurement pad 60 is arranged on the front surface of the control circuit board 50, the region for arranging other electronic components or wirings is lessened. In this embodiment, by arranging the resistance measurement pad 60 on the side surface of the control circuit board 50, a large region is secured for arranging electronic components or wirings on the front surface of the control circuit board 50. Further, in this embodiment, the measurement device 100 is configured to measure the resistance value of the object to be inspected by the three-terminal method or the four-terminal method, and hence the measurement is not affected by the voltage drop caused by the wiring resistance in the region from the object to be inspected to the resistance measurement pad 60. Therefore, the wiring path of the connection wiring 80 for electrical connection between each connection portion and each inspection terminal 61 may be long, and thus the resistance value can be measured at high accuracy even when the resistance measurement pad 60 is arranged on the side surface of the control circuit board 50.

Next, the specific shape of the resistance measurement pad 60 according to this embodiment is described. FIG. 9 to FIG. 14 are perspective views for illustrating examples of the control circuit board 50 including the resistance measurement pad 60 according to this embodiment.

Figure 9:
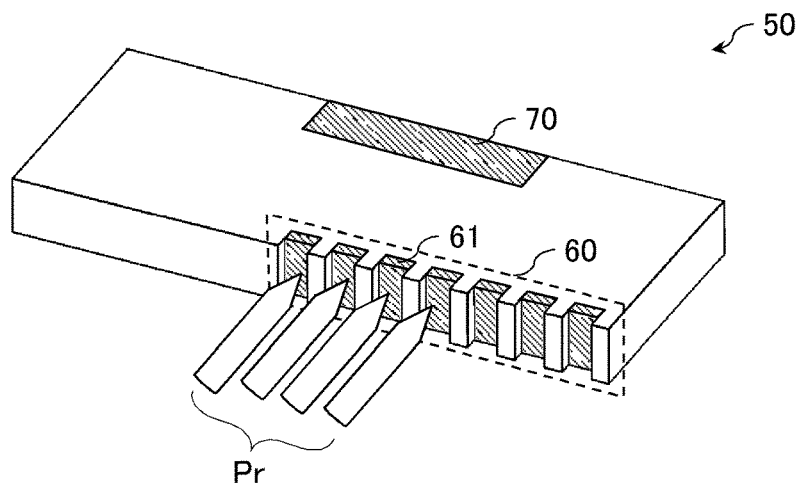
FIG. 9 is a perspective view for illustrating an example of the control circuit board including the resistance measurement pad according to the embodiment.

In the control circuit board 50 illustrated in FIG. 9, each inspection terminal 61 of the resistance measurement pad 60 is formed into a recessed shape in the side surface of the control circuit board 50. By forming each inspection terminal 61 of the resistance measurement pad 60 into a recessed shape, the probe pins Pr can be easily positioned. Further, the probe pins Pr are less liable to be shifted in the lateral direction when being brought into abutment against the inspection terminals 61. Therefore, the probe pins Pr can be easily brought into abutment against the inspection terminals 61.

Figure 10:
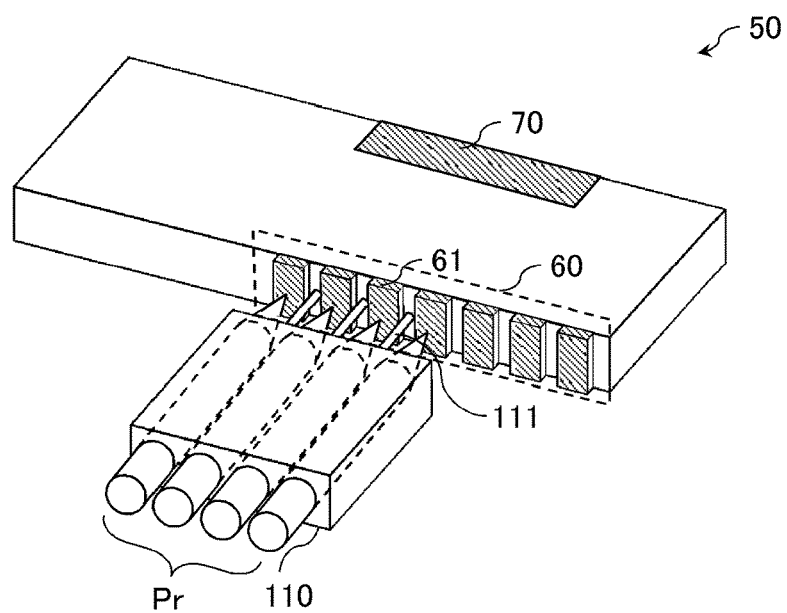
FIG. 10 is perspective view for illustrating an example of the control circuit board including the resistance measurement pad according to the embodiment.

In the control circuit board illustrated in FIG. 10, each inspection terminal 61 of the resistance measurement pad 60 is formed into a projecting shape in the side surface of the control circuit board 50. By forming each inspection terminal 61 of the resistance measurement pad 60 into a projecting shape, a recess between two adjacent terminals can be used for positioning the probe pins Pr. For example, when a measurement jig unit 110 capable of arranging the four probe pins Pr at predetermined intervals (for example, at intervals of two adjacent inspection terminals 61) is used, a protrusion 111 is provided to the measurement jig unit 110 between two adjacent probe pins Pr so as to correspond to the recess between the two inspection terminals 61. Then, by fitting the protrusion 111 to the recess between the two inspection terminals 61, the probe pins Pr can be positioned. Further, by fitting the protrusion 111 to the recess between the two inspection terminals 61, the probe pins Pr are less liable to be shifted in the lateral direction when being brought into abutment against the inspection terminals 61. Therefore, the probe pins Pr can be easily brought into abutment against the inspection terminals 61.

Figure 11:
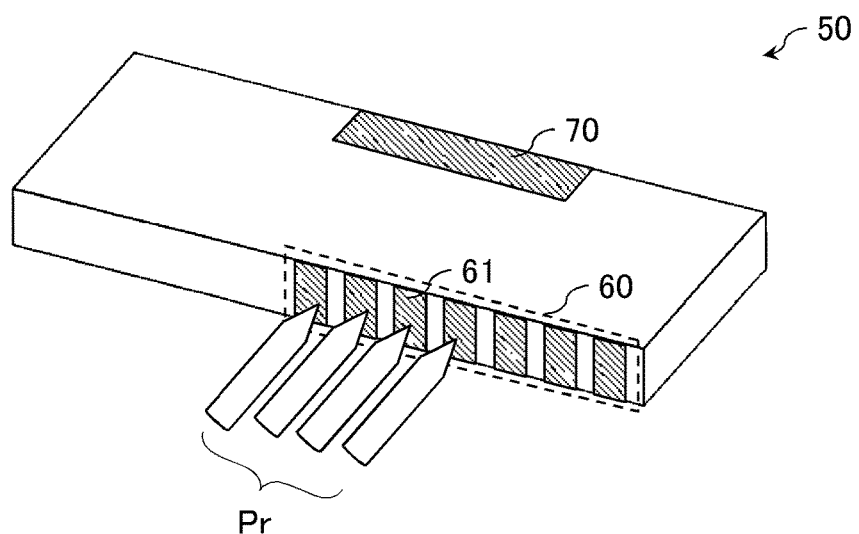
FIG. 11 is a perspective view for illustrating an example of the control circuit board including the resistance measurement pad according to the embodiment.
Figure 12:
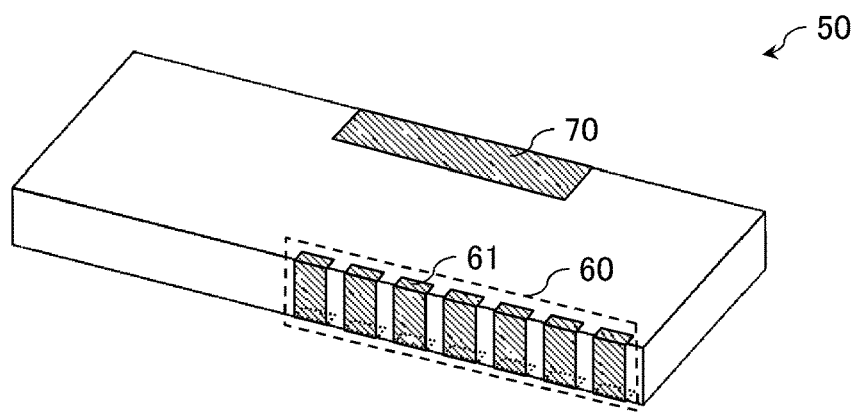
FIG. 12 is a perspective view for illustrating an example of the control circuit board including the resistance measurement pad according to the embodiment.
Figure 13:
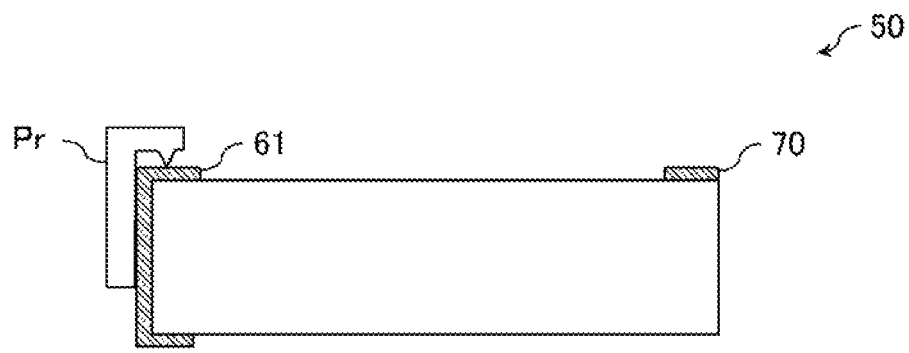
FIG. 13 is a view for illustrating an example of a probe pin to be brought into abutment against the resistance measurement pad.

In the control circuit board 50 illustrated in FIG. 11, each inspection terminal 61 of the resistance measurement pad 60 is formed into a planar shape along the side surface of the control circuit board 50. Further, in the control circuit board 50 illustrated in FIG. 12, each inspection terminal 61 of the resistance measurement pad 60 is formed into a planar shape along the side surface of the control circuit board 50, and further parts of each inspection terminal 61 are arranged on the front surface and the back surface of the control circuit board 50. For example, each inspection terminal 61 is formed so as to be extended from the side surface of the control circuit board 50 to the front surface and the back surface. Note that, a part of each inspection terminal 61 may be arranged on the front surface or the back surface of the control circuit board 50. FIG. 13 is a view for illustrating an example of the probe pin Pr to be brought into abutment against the resistance measurement pad 60 illustrated in FIG. 12. FIG. 13 is a view for illustrating the control circuit board 50 as viewed from the side surface side. As illustrated in FIG. 13, the probe pin Pr is bent so as to extend along the front surface of the resistance measurement pad 60, and a leading end of the probe pin Pr is formed so as to be brought into abutment against a part of the inspection terminal 61 arranged on the front surface of the control circuit board 50. With this, the probe pin Pr can be easily held under a state in which the leading end of the probe pin Pr is brought into abutment against the inspection terminal 61. Abutment of the probe pin Pr against the planar terminal illustrated in FIG. 11 is difficult in positioning because the leading end of the probe pin Pr is liable to be misaligned. However, by using the inspection terminal 61 and the probe pin Pr as illustrated in FIG. 13, the probe pin Pr can be easily brought into abutment against the inspection terminal 61.

Figure 14:
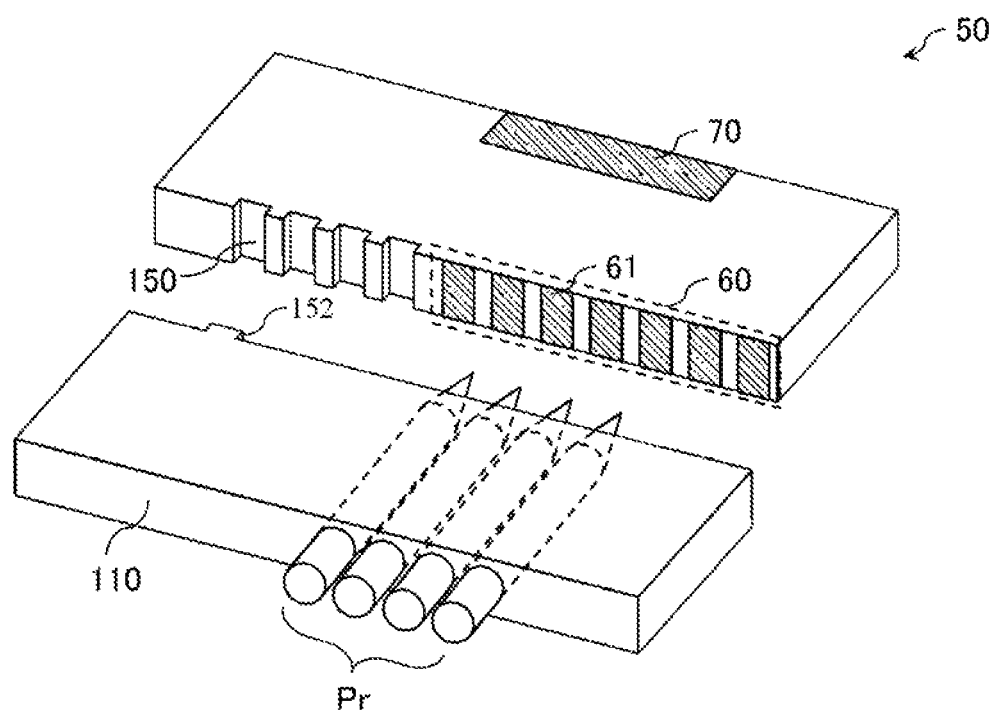
FIG. 14 is a perspective view for illustrating an example of the control circuit board including the resistance measurement pad according to the embodiment.

In the control circuit board 50 illustrated in FIG. 14, recessed portion 150 for positioning are formed in the side surface on which the resistance measurement pad 60 is arranged. Further, in the measurement jig unit 110, a projecting portion 152 is formed so as to correspond to the recessed portions 150 for positioning formed in the control circuit board 50. The recessed portions 150 and the projecting portion 151 are formed at positions based on the combination of the inspection terminals 61 against which the probe pins Pr are brought into abutment. Further, the recessed portions 150 may be formed as many as the number of the objects to be measured. By fitting projecting portion 152 of the measurement jig unit 110 to the recessed portion 150 formed in the control circuit board 50, the probe pins Pr are brought into abutment against the predetermined inspection terminals 61. Abutment of the probe pins Pr to the planar inspection terminals 61 illustrated in FIG. 11 is difficult in positioning because the leading ends of the probe pins Pr are liable to be misaligned. However, by using the control circuit board 50 and the measurement jig unit 110 as illustrated in FIG. 14, the probe pins Pr can be easily brought into abutment against the inspection terminals 61. Note that, the projecting portion for positioning may be formed on the control circuit board 50, and the recessed portions corresponding to the projecting portion for positioning may be formed in the measurement jig unit 110.

Figure 15:
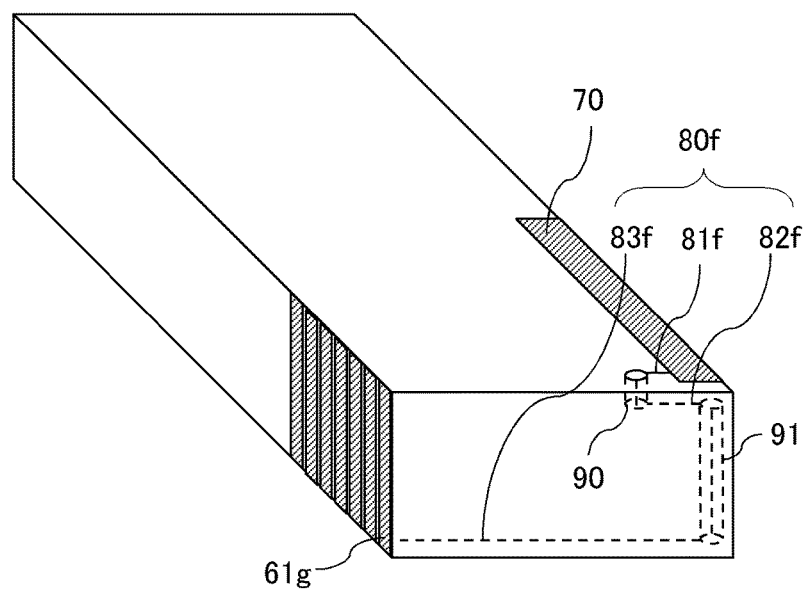
FIG. 15 is a view for illustrating an example of connection wiring formed to the control circuit board.

Further, the connection wiring 80 configured to electrically connect each connection portion and each inspection terminal 61 to each other may be formed on the front surface of the control circuit board 50, or at least a part of the connection wiring 80 may be formed on the back surface or in the inner layer of the control circuit board 50. FIG. 15 is a view for illustrating an example of the connection wiring 80 formed to the control circuit board 50. In FIG. 15, for the sake of convenience, only the connection wiring 80$f$ connected to the seventh inspection terminal 61$g$ is illustrated, but the same applies to the connection wirings 80$a$ to 80$f$ connected to the first inspection terminal 61$a$ to the sixth inspection terminal 61$f$, respectively.

As illustrated in FIG. 15, the connection wiring 80$f$ includes a first connection wiring 81$f$, a second connection wiring 82$f$, and a third connection wiring 83$f$. The first connection wiring 81$f$ is formed on the front surface of the control circuit board 50 to electrically connect between the connection terminal 70 and a first through hole 90. In plan view, the first through hole 90 is formed at a position separated away from the connection terminal 70. The second connection wiring 82$f$ is formed in the inner layer of the control circuit board 50 to electrically connect between the first through hole 90 and a second through hole 91. The second through hole 91 is formed below the connection terminal 70. The third connection wiring 83$f$ is formed on the back surface of the control circuit board 50 to electrically connect between the second through hole 91 and the seventh inspection terminal 61$g$. The first connection wiring 81$f$ and the second connection wiring 82$f$ are electrically connected to each other via the first through hole 90. Further the second connection wiring 82$f$ and the third connection wiring 83$f$ are electrically connected to each other via the second through hole 91.

As described above, by forming at least a part of the connection wiring 80$f$ in the inner layer or on the back surface of the control circuit board 50, a large region can be secured for arranging electronic components or wirings on the front surface of the control circuit board 50. In particular, in the resistance measurement by the four-terminal method, the resistance value of the object to be inspected can be measured without being affected by the voltage drop caused by the wiring resistance in the region from the object to be inspected to the resistance measurement pad 60. Therefore, the wiring path of the connection wiring 80$f$ may be long. Therefore, the connection wiring 80$f$ can be routed in a region of the control circuit board 50 in which electronic components or major wirings are not formed. In FIG. 15, the second through hole 91 is formed below the connection terminal 70, and the third connection wiring 83$f$ is formed on the back surface of the control circuit beard 50 where the wiring is not formed.

Note that, the wiring pattern of the connection wiring 80$f$ is not limited to the example illustrated in FIG. 15. For example, the third connection wiring 83$f$ may be formed in a layer different from the layer in which the second connection wiring 82$f$ is formed in the inner layer of the control circuit board 50. Further, without forming the second through hole 91 and the second connection wiring 82$f$, the first connection wiring 81$f$ and the third connection wiring 83$f$ may be electrically connected to each other via the first through hole 90. As described above, the connection wiring 80$f$ can be freely routed to a region that does not hinder the wiring pattern of the control circuit board 50 depending on the wiring pattern of the control circuit board 50.

Figure 16:
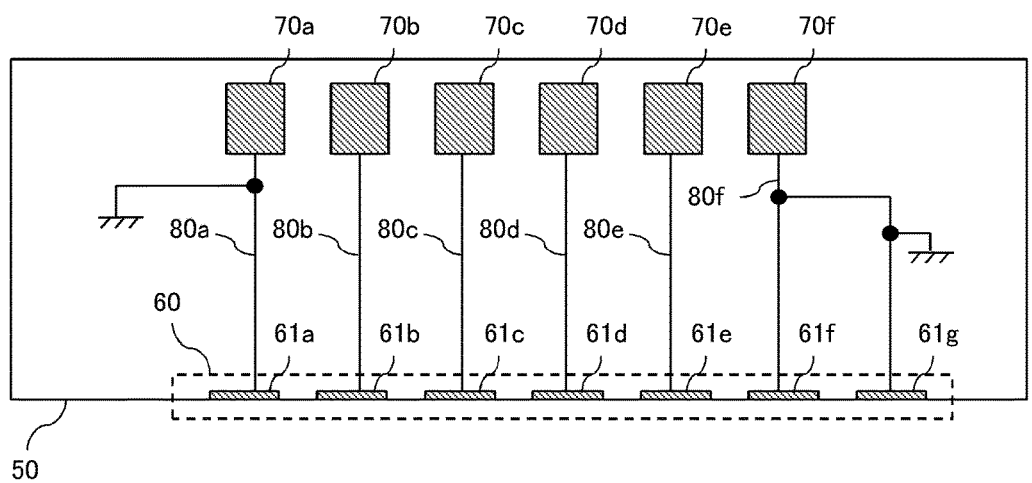
FIG. 16 is a view for schematically illustrating the control circuit board in which a part of the resistance measurement pad is connected to the ground.
Figure 17:
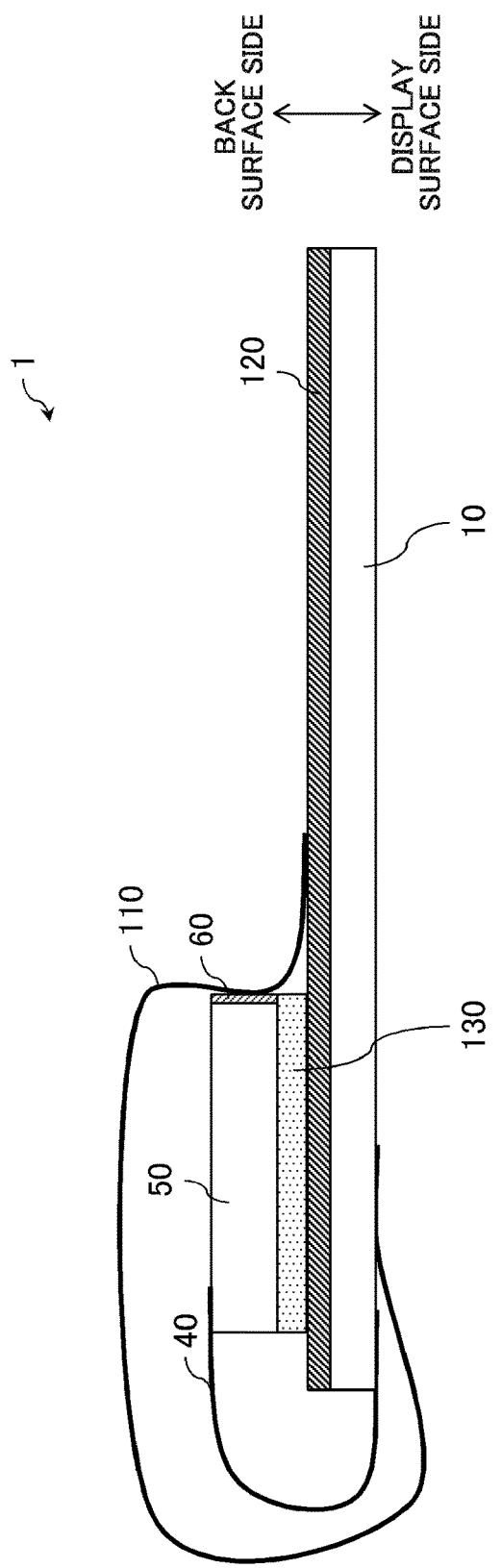
FIG. 17 is a sectional view of a display device to which the control circuit board illustrated in FIG. 16 is applied.

Further, in the control circuit board 50 of this embodiment, a part of the resistance measurement pad 60 may be connected to the ground. FIG. 16 is a view for schematically illustrating the control circuit board 50 in which a part of the resistance measurement pad 60 is connected to the ground. FIG. 17 is a sectional view of the display device 1 to which the control circuit board 50 illustrated in FIG. 16 is applied. In FIG. 17, the first inspection terminal 61$a$ and the seventh inspection terminal 61$g$ are connected to the signal ground of the control circuit board 50. The signal ground is formed in the inner layer or on the back surface of the control circuit board 50, for example. Note that, when a part of the resistance measurement pad 60 is connected to the signal ground of the control circuit board 50, occurrence of short-circuit between the inspection terminals 61, by which the inspection by the four-terminal method may be affected, is prevented. Further, it is preferred to shorten and thicken the path extending from the inspection terminal 61 to the ground as much as possible so as to reduce the wiring resistance.

As illustrated in FIG. 17, a metallic frame 120 configured to support the display panel 10 is arranged on the back surface side of the display panel 10. The control circuit board 50 is arranged on the back surface side of the frame 120. Further, the control circuit board 50 is fixed to the frame 120 by an insulating tape 130. Further, a protection cover tape 110 is arranged so as to cover the control circuit board 50 and the FPC 40. The protection cover tape 110 has a layer structure in which a conductive member such as a copper foil is sandwiched between insulating films from both sides. Then, in a region in which the protection cover tape 110 and the control circuit board 50 (in this case, the resistance measurement pad 60 arranged on the side surface of the control circuit board 50) are in contact with each other, the protection cover tape 110 is bonded to a part of the resistance measurement pad 60 so as to be electrically connected thereto. Further, in a region in which the protection cover tape 110 and the lower frame 120 are in contact with each other, the protection cover tape 110 is bonded to the lower frame 120 so as to be electrically connected thereto. In this case, the protection cover tape 110 is bonded to the first inspection terminal 61a and the seventh inspection terminal 61g illustrated in FIG. 16 so as to be electrically connected thereto. As described above, the signal ground of the control circuit board 50 is connected to the frame ground via the resistance measurement pad 60 (in this case, the first inspection terminal 61a and the seventh inspection terminal 61g), thereby being capable of reducing the discharge of the electromagnetic waves from the circuit components mounted on the control circuit board 50 and reducing the influence of the electromagnetic waves applied from the periphery. In general, the resistance measurement pad 60 serving as the inspection terminals is unnecessary after the inspection is ended and the display device 1 is assembled, but according to this configuration, the resistance measurement pad 60 can be used for blocking electromagnetic waves of the control circuit board 50 even after the display device 1 is assembled. Further, it is unnecessary to separately form a ground opening portion in the front surface of the control circuit board 50 for electrical connection to the protection cover tape 110, and a large region can be secured for arranging electronic components or wirings in the control circuit board 50.

Figure 18:
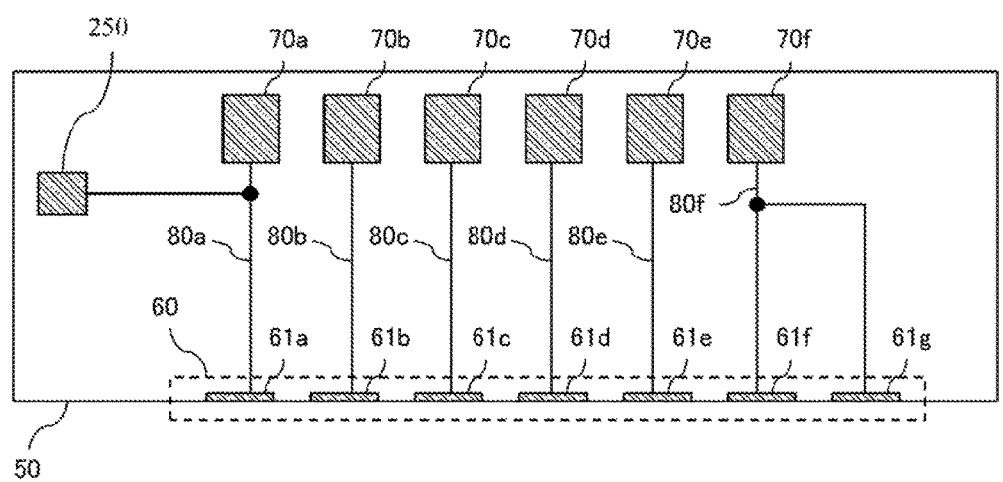
FIG. 18 is a view for schematically illustrating the control circuit board in which a part of the resistance measurement pad is connected to a heat radiation pad.

Further, in the control circuit board 50 of this embodiment, a part of the resistance measurement pad 60 may be connected to a heat radiation terminal. The heat radiation terminal is assumed to be, for example, a heat radiation pad 250 (see FIG. 18) formed for heat radiation of an IC mounted on the control circuit board 50. FIG. 18 is a view for schematically illustrating the control circuit board 50 in which a part of the resistance measurement pad 60 is connected to the heat radiation pad 250. In FIG. 18, the first inspection terminal 61a and the heat radiation pad 250 are electrically connected to each other, thereby being capable of promoting the heat radiation of the IC by the first inspection terminal 61a. In general, the resistance measurement pad 60 serving as the inspection terminals is unnecessary after the inspection is ended and the display device 1 is used, but according to this configuration, the resistance measurement pad 60 can be used for promoting the heat radiation of the IC mounted on the control circuit board 50 even during use of the display device 1.

In this case, it is preferred to shorten and thicken the wiring path extending from the inspection terminal 61 to the heat radiation pad 250 or the wiring path extending from the inspection terminal 61 to the signal ground as much as possible so as to reduce the wiring resistance. By reducing the wiring resistance in the region from the inspection terminal 61 to the heat radiation pad 250, the heat radiation effect can be enhanced, and by reducing the wiring resistance in the region from the inspection terminal 61 to the signal ground, the electromagnetic wave blocking effect can be enhanced. For example, by connecting the heat radiation pad 250 to the inspection terminal 61 positioned close to the heat radiation pad 250, the wiring resistance can be reduced. Further, by forming a plurality of wiring paths extending from the inspection terminal 61 to the heat radiation pad 250, and causing the wiring paths to pass through different layers of the control circuit board 50, the wiring resistance can be reduced. Similarly, by forming a plurality of wiring paths extending from the inspection terminal 61 to the signal ground, and causing the wiring paths to pass through different layers of the control circuit board 50, the wiring resistance can be reduced.

Figure 19:
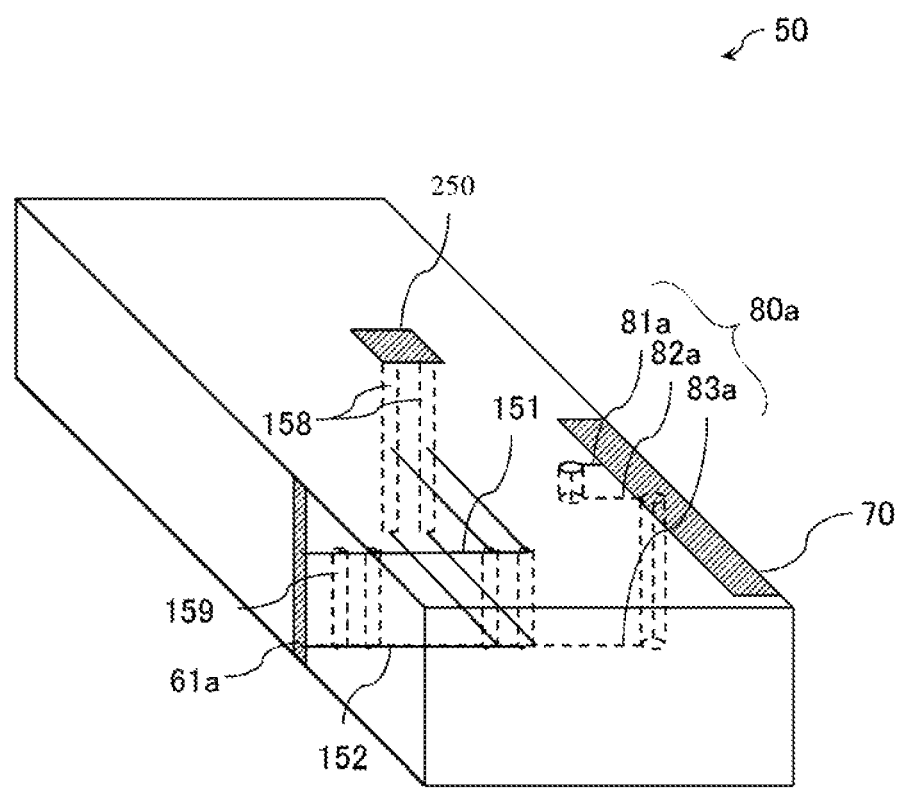
FIG. 19 is a view for schematically illustrating an inner layer of the control circuit board illustrated in FIG. 18.

The configuration of forming a plurality of wiring paths extending from the inspection terminal 61 to the heat radiation pad 250 is described with reference to FIG. 19. FIG. 19 is a view for schematically illustrating the inner layer of the control circuit board 50 illustrated in FIG. 18. In FIG. 19, for the sake of convenience, only the first inspection terminal 61a of the resistance measurement pad 60 is illustrated. As illustrated in FIG. 19, two wirings connected to the first inspection terminal 61a (heat radiation pad connection wiring 151 and heat radiation pad connection wiring 152) are formed, and the heat radiation pad connection wiring 151 and the heat radiation pad connection wiring 152 are formed in layers different from each other. Further, the first inspection terminal 61a and the heat radiation pad 250 are electrically connected to each other via the heat radiation pad connection wiring 151 and the heat radiation pad connection wiring 152. Further, the heat radiation pad connection wiring 151 and the heat radiation pad connection wiring 152 are electrically connected to the heat radiation pad 250 via through holes 158. As described above, by electrically connecting the first inspection terminal 61a and the heat radiation pad 250 to each other via a plurality of layers of the control circuit board 50, the wiring resistance between the first inspection terminal 61a and the heat radiation pad 250 can be reduced to enhance the heat radiation effect. Further, the heat radiation pad connection wiring 151 and the heat radiation pad connection wiring 152 are electrically connected to each other via plurality of through holes 159, thereby being capable of further reducing the wiring resistance. Further, the heat radiation pad 250 has the ground potential in many cases, and hence the effect of blocking electromagnetic waves of the control circuit board 50 is also obtained together with the enhancement of the heat radiation effect.

Further, in FIG. 19, similarly to the connection wiring 80f illustrated in FIG. 15, the connection wiring 80a includes a first connection wiring 81a formed on the front surface of the control circuit board 50, a second connection wiring 82a formed in the inner layer of the control circuit board 50, and a third connection wiring 83a formed on the back surface of the control circuit board 50. In this case, the heat radiation pad connection wiring 151 and the second connection wiring 82a or the third connection wiring 83a may be formed in the same layer, or may be formed in layers different from each other. Further, the heat radiation pad connection wiring 152 and the second connection wiring 82a or the third connection wiring 83a may be formed in the same layer, or may be formed in layers different from each other.

Note that, in the configuration of forming a plurality of wiring paths extending from the inspection terminal 61 to the signal ground when the heat radiation pad 250 and the heat radiation pad connection wiring are replaced with the ground and the ground connection wiring, respectively, in the above description, there is obtained a configuration similar to the configuration illustrated in FIG. 19.

Figure 20:
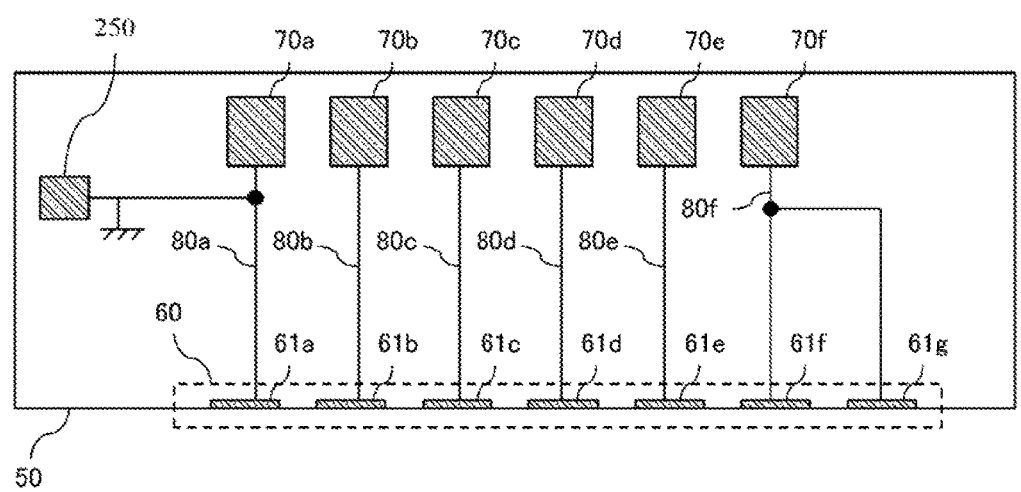
FIG. 20 is a view for schematically illustrating the control circuit board in which the ground and the heat radiation pad are connected to the resistance measurement pad.

Further, the configuration illustrated in FIG. 16 and the configuration illustrated in FIG. 18 may be combined with each other for use. FIG. 20 is a view for schematically illustrating the control circuit board 50 in which the ground and the heat radiation pad are connected to the resistance measurement pad 60. In FIG. 20, the first inspection terminal 61a is electrically connected to the signal ground and the heat radiation pad 250. Other configurations are similar to those described with reference to FIG. 16 to FIG. 19, and hence description thereof is omitted. As described above, by electrically connecting the first inspection terminal 61a to the signal ground and the heat radiation pad 250, the configuration becomes more effective for the blocking of the electromagnetic waves of the control circuit board 50 and the heat radiation of the IC mounted on the control circuit board 50.

While there have been described what are at present considered to be certain embodiments of the application, it will be understood that various modifications may be made thereto, and it is intended that the appended claims cover all such modifications as fall within the true spirit and scope of the invention.

What is claimed is:

1. A circuit board, comprising:
   a connection terminal, which is arranged on a front surface or in an inner layer of the circuit board, and is electrically connected to an object to be inspected;
   three or more inspection terminals, which are electrically connected to the connection terminal, and are configured to measure a resistance value of the object to be inspected,
   each of the three or more inspection terminals being arranged on a side surface of the circuit board; and
   a plurality of recessed portions formed on the side surface of the circuit board, a distance between two adjacent recessed portions from the plurality of recessed portions being the same as a distance between two adjacent inspection terminals from the three or more inspection terminals,
   wherein the three or more inspection terminals are arranged in a planar shape along the side surface of the circuit board.

2. The circuit board according to claim 1,
   wherein the connection terminal is arranged on a first edge side of the circuit board, and
   wherein the three or more inspection terminals are arranged on the side surface at an edge other than the first edge.

3. The circuit board according to claim 1, wherein the three or more inspection terminals are arranged side by side in one row along the side surface of the circuit board.

4. The circuit board according to claim 3, wherein the three or more inspection terminals have equal distances between adjacent inspection terminals.

5. The circuit board according to claim 3, wherein the three or more inspection terminals have different distances between adjacent inspection terminals.

6. The circuit board according to claim 1,
   wherein the connection terminal comprises a first connection terminal and a second connection terminal,
   wherein the three or more inspection terminals comprise a first inspection terminal, a second inspection terminal, and a third inspection terminal,
   wherein the first connection terminal is electrically connected to the first inspection terminal via a first connection wiring,
   wherein the second connection terminal is electrically connected to the second inspection terminal and the third inspection terminal via a second connection wiring, and
   wherein the second connection wiring is formed so as to be extended from the second connection terminal, and then be branched to be connected to each of the second inspection terminal and the third inspection terminal.

7. The circuit board according to claim 6, wherein the second connection wiring is branched at a position closer to the second connection terminal than to the second inspection terminal and the third inspection terminal.

8. The circuit board according to claim 1,
   wherein be three or more inspection terminals comprise seven terminals comprising a first inspection terminal, a second inspection terminal, a third inspection terminal, a fourth inspection terminal, a fifth inspection terminal, a sixth inspection terminal, and a seventh inspection terminal,
   wherein the first inspection terminal, the second inspection terminal, the third inspection terminal, and the fourth inspection terminal are used for measuring a resistance value of a first object to be inspected,
   wherein the third inspection terminal, the fourth inspection terminal, the fifth inspection terminal, and the sixth inspection terminal are used for measuring a resistance value of a second object to be inspected, and
   wherein the fourth inspection terminal, the fifth inspection terminal, the sixth inspection terminal, and the seventh inspection terminal are used for measuring a resistance value of a third object to be inspected.

9. The circuit board according to claim 1, wherein the side surface of the circuit board has one of a recessed portion and a projecting portion formed therein so as to position a measurement jig when the measurement jig is brought into abutment against the three or more inspection terminals.

10. The circuit board according to claim 1, further comprising a connection wiring configured to electrically connect the connection terminal and corresponding one of the three or more inspection terminals to each other,
    wherein the connection wiring is formed on a back surface or in the inner layer of the circuit board.

11. The circuit board according to claim 10, wherein the connection wiring is electrically connected to the connection terminal and corresponding one of the three or more inspection terminals via a through hole formed through the circuit board.

12. The circuit board according to claim 1, wherein at least one of the three or more inspection terminals is electrically connected to a ground.

13. The circuit board according to claim 1, wherein at least one of the three or more inspection terminals is electrically connected to a heat radiation pad configured to radiate heat of an IC included in the circuit board.

14. A display device, comprising the circuit board of claim 1.

15. The display device according to claim 14, further comprising:
    a display panel;
    a frame, which is made of a metal, and is configured to support the display panel from a back surface side thereof; and
    a protection tape configured to cover the circuit board,
    wherein the circuit board is arranged on a back surface side of the frame,
    wherein the protection tape is electrically connected to at least one of the three or more inspection terminals, and
    wherein the protection tape is electrically connected to the frame.

* * * * *